US007313649B2

(12) United States Patent
Tomita et al.

(10) Patent No.: US 7,313,649 B2
(45) Date of Patent: Dec. 25, 2007

(54) FLASH MEMORY AND PROGRAM VERIFY METHOD FOR FLASH MEMORY

(75) Inventors: Yasuhiro Tomita, Toyonaka (JP); Hitoshi Suwa, Takatsuki (JP); Manabu Komiya, Kyoto (JP); Tamas Toth, Kefar Yona (IL); Jeffrey Allan Jacob, Raanana (IL); Avi Parvin, Netanya (IL); Noam Eshel, Pardesia (IL)

(73) Assignees: Matsushita Electric Industrial Co., Ltd., Osaka (JP); Tower Semiconductor Ltd., Migdal Haemek (IL)

( * ) Notice: Subject to any disclaimer, the term of this patent is extended or adjusted under 35 U.S.C. 154(b) by 393 days.

(21) Appl. No.: 11/116,440

(22) Filed: Apr. 28, 2005

(65) Prior Publication Data

US 2005/0286299 A1 Dec. 29, 2005

(30) Foreign Application Priority Data

Apr. 28, 2004 (JP) ............................. 2004-134485

(51) Int. Cl.
*G06F 12/00* (2006.01)
(52) U.S. Cl. .............. 711/103; 365/185.08; 365/185.22
(58) Field of Classification Search ........... 365/185.08, 365/185.16, 185.22–24; 711/103
See application file for complete search history.

(56) References Cited

U.S. PATENT DOCUMENTS

| 5,151,375 | A | 9/1992 | Kazerounian et al. |
| 5,204,835 | A | 4/1993 | Eitan |
| 5,768,192 | A | 6/1998 | Eitan |
| 5,930,167 | A * | 7/1999 | Lee et al. .............. 365/185.03 |
| 5,963,465 | A | 10/1999 | Eitan |
| 6,011,725 | A | 1/2000 | Eitan |
| 6,134,156 | A | 10/2000 | Eitan |
| 2005/0135154 | A1* | 6/2005 | Tanaka et al. ......... 365/185.22 |
| 2005/0185468 | A1* | 8/2005 | Hosono et al. ........ 365/185.22 |

FOREIGN PATENT DOCUMENTS

WO  WO 99/07000  2/1999

* cited by examiner

*Primary Examiner*—Woo H. Choi
(74) *Attorney, Agent, or Firm*—McDermott Will & Emery LLP

(57) ABSTRACT

In conventional memory arrays in which a bit line is shared by memory cells, a cell current flows over into neighbor cell(s) in a program verify process, and therefore, the threshold of a memory cell to be programmed is erroneously determined to be lower. Therefore, in a program verify process, a control circuit 3 writes a fail value to a neighbor cell buffer 5 when all neighbor cell(s) having an offset of n or less from a memory cell to be programmed are in the erased state, and when otherwise, writes a pass value to the neighbor cell buffer 5. The control circuit 3 verifies input write data and also verifies data stored in the neighbor cell buffer(s). In the latter verify process, a verify voltage higher than an ordinary one is used to compensate for the leakage of cell current.

28 Claims, 8 Drawing Sheets

Fig. 8A

| WB | PREVIOUS NB | NEXT NB |
|---|---|---|
| 0 | X | 0 |
| 1 | X | 1 |

Fig. 8B

| SA | PREVIOUS NB | NEXT NB |
|---|---|---|
| 0 (PROGRAMMED) | X | 1 |
| 1 (ERASED) | 0 | 0 |
| 1 (ERASED) | 1 | 1 |

Fig. 8C

| SA | PREVIOUS WB | NEXT WB |
|---|---|---|
| 0 (PROGRAMMED) | 0 | 1 |
| 1 (ERASED) | 0 | 0 |
| X | 1 | 1 |

Fig. 8D

| SA | PREVIOUS NB | NEXT NB |
|---|---|---|
| 0 (PROGRAMMED) | 0 | 1 |
| 1 (ERASED) | 0 | 0 |
| X | 1 | 1 |

Fig. 8E

| WB | NB | PROGRAM PULSE |
|---|---|---|
| 0 | 0 | YES |
| 0 | 1 | YES |
| 1 | 0 | YES |
| 1 | 1 | NO |

Fig. 10

| OFFSET=1 | OFFSET=2 | OFFSET=3 | VERIFY LEVEL |
|---|---|---|---|
| O (PROGRAMMED) | X | X | PVV |
| 1 (ERASED) | O (PROGRAMMED) | X | PVV+D1 |
| 1 (ERASED) | 1 (ERASED) | O (PROGRAMMED) | PVV+D1+D2 |
| 1 (ERASED) | 1 (ERASED) | 1 (ERASED) | PVV+D1+D2+D3 |

FLASH MEMORY AND PROGRAM VERIFY METHOD FOR FLASH MEMORY

BACKGROUND OF THE INVENTION

1. Field of the Invention

The present invention relates to a flash memory comprising a memory array in which a bit line is shared by memory cells, and a program verify method for the same.

2. Description of the Background Art

In conventional non-volatile memories, such as a flash memory, an EEPROM and the like, a floating gate type memory cell which uses an electrical conductor material (e.g., polysilicon, etc.) as data storage means is employed. In recent years, an NROM (Nitride Read-Only Memory) type memory cell which uses an insulator ONO film (a composite structure of a nitride film and oxide films) has attracted attention as data storage means in order to improve the degree of integration and reliability.

When the NROM type memory cell is used to construct a memory array, a virtual ground array technology is employed in which a bit line is shared by memory cells neighboring each other. In the virtual ground array type memory array, a bit line shared by memory cells neighboring each other in a direction of a word line (the bit line is hereinafter referred to as a diffused bit line) is provided in addition to the memory cell and the word line (see FIG. 2 described below). By sharing the bit line in this manner, the NROM type memory cell can be used to construct a highly integrated memory array.

A program process and an erase process with respect to the NROM type memory cell will be described. By externally applying a certain voltage to the NROM type memory cell, a channel current flows between a drain and a source, so that hot electrons can be injected into the memory cell. Also, by externally applying another voltage to the memory cell, hot holes generated by an interband tunnel effect can be injected into the memory cell. The memory cell into which hot electrons have been injected goes to a high threshold state, while the memory cell into which hot holes have been injected goes to a low threshold state. Hereinafter, the high threshold state is referred to as a programmed state, while the low threshold state is referred to as an erased state. The programmed state and the erased state are associated with, for example, a 0-storing state and a 1-storing state, respectively.

A process of transitioning a memory cell from the programmed state to the erased state is generally executed with respect to a plurality of memory cells simultaneously. In contrast, a process of transitioning a memory cell from the erased state to the programmed state is executed for each memory cell individually. Hereinafter, a process of simultaneously transitioning a plurality of memory cells into the erased state is referred to as an erase process, while a process of transitioning a designated memory cell(s) among a plurality of memory cells into the programmed state is referred to as a program process. The program process and the erase process are executed mainly by applying a pulse having a predetermined voltage level to a drain-side diffused bit line while applying a voltage having a predetermined level to a desired word line (gate line). Also in the program process and the erase process, after applying a pulse, a verify process is executed to determine whether or not a state of a memory cell is changed. Particularly, a verify process in a program process is referred to as a program verify process.

A source-side read scheme is widely known as a method of reading out data from a virtual ground array type memory array. In the source-side read scheme, all diffused bit lines are temporarily connected to a ground potential before selection of a memory cell to be read out, and thereafter, are controlled to be in a high impedance state. A gate bias is applied via a word line to the gate of the memory cell to be read out, a read drain bias (e.g., about 2 V) is applied to the drain thereof, and a source-side diffused bit line is connected to a sense amplifier. By applying these voltages, a current is caused to flow through the memory cell (hereinafter, the current is referred to as a cell current). The cell current flows through the source-side diffused bit line. The sense amplifier compares the cell current flowing through the source-side diffused bit line with a reference cell current obtained by another means. When the cell current is larger than the reference cell current, data read from the memory cell is determined to be 1, and when otherwise, the data is determined to be 0.

Hereinafter, a memory cell M, and a memory cell M' which is one of the memory cells connected to the same word line as that to which the memory cell M is connected, the memory cell M' being disposed on a source side (read bit line side) of the memory cell M, will be discussed. The number of memory cells disposed between the memory cell M (exclusive) and the memory cell M' (inclusive) is referred to as an offset. A memory cell which is located at an offset of a predetermined number n or less (where n is a positive integer) from the memory cell M is referred to as a neighbor cell. For example, a memory cell M1 which shares its source-side diffused bit line with the memory cell M is called a 1st-offset neighbor cell with respect to the memory cell M. A memory cell M2 which shares its drain-side diffused bit line with the memory cell M1 is referred to as a 2nd-offset neighbor cell with respect to the memory cell M (see FIG. 2 described below)

Note that a detailed operation of an NROM type memory cell is described in, for example, International Publication WO99/07000, U.S. Pat. Nos. 5,768,192, 6,011,725 and the like. The virtual ground array technology is described in U.S. Pat. Nos. 5,963,465, 5,204,835, and U.S. Pat. No. 5,151,375. The source-side read scheme is described in detail in U.S. Pat. No. 6,134,156.

However, a flash memory having the virtual ground array type memory array has a problem that a neighbor cell effect occurs in the memory array, resulting in a reduction in reliability. The memory cell M included in the virtual ground array type memory array shares its source-side diffused bit line with the 1st-offset neighbor cell M1. Since the neighbor cell M1 is connected to the same word line as that of the memory cell M, the neighbor cell M1 as well as the memory cell M are selected when data is read from the memory cell M. Therefore, when data is read from the memory cell M, a portion of a cell current of the memory cell M flows into the neighbor cell M1, so that a cell current which is detected by the sense amplifier connected to the source-side diffused bit line of the memory cell M, is reduced. This phenomenon is called a loss of a cell current due to neighbor cell(s) (hereinafter also simply referred to as a neighbor cell effect).

When the neighbor cell effect occurs, an amount of the cell current detected by the sense amplifier varies depending on states of neighbor cell(s) even when the memory cell to be read out has the same state. More specifically, the amount of a cell current detected by a sense amplifier varies depending on the number of consecutive erased-state neighbor cells counted from a 1st-offset neighbor cell. As an example, a first case in which the above-described number is 0 (i.e., the 1st-offset neighbor cell is in the programmed state) is compared with a second case in which the number is 3 (i.e., 1st- to 3rd-offset neighbor cells are in the erased state and a 4th-offset neighbor cell is in the programmed state). In this case, the amount of a current flowing through the neighbor cell is larger in the second case, assuming that the memory cell to be read out is in the same state. Therefore, the amount of a cell current detected by the sense amplifier is smaller in the second case.

The phenomenon that a cell current varies depending on the states of neighbor cell(s), also occurs in a program verify process. Therefore, the number of times of applying a pulse to a memory cell so that the memory cell is transitioned to the programmed state, i.e., a threshold of the memory cell, also varies depending on the states of neighbor cell(s). For example, when a memory cell is transitioned to the programmed state in the first and second cases, a cell current detected by a sense amplifier in a program verify process is smaller in the second case than in the first case. Therefore, in the second case, the number of times of applying a pulse is erroneously determined to be smaller than that of the first case.

Since the number of times of applying a pulse varies depending on the states of neighbor cell(s), the threshold of a memory cell in the programmed state is distributed in a wide range of a lower level region than an ideal one. Therefore, a read margin is decreased or the reliability of a flash memory is reduced. Therefore, it is recognized that it is important to eliminate an influence of the neighbor cell effect for a flash memory comprising a virtual ground array type memory array.

SUMMARY OF THE INVENTION

Therefore, an object of the present invention is to provide a flash memory which eliminates an influence of the neighbor cell effect and has a high level of reliability, and a program verify method for the same.

The present invention has the following features to attain the object mentioned above.

The flash memory of the present invention is a flash memory having a program verify function, which comprises: a flash memory array including memory cells, a word line, and a bit line shared by memory cells neighboring each other in a direction of the word line; a write buffer functioning as a buffer for write data to the flash memory array; a neighbor cell buffer having a capacity which is larger than or equal to that of the write buffer; and a control circuit executing a program verify process with respect to the flash memory array. The control circuit writes the input write data to the write buffer, executes a logical operation based on the write data and data read from the flash memory array, writes an obtained result as neighbor cell data to the neighbor cell buffer, executes a verify process between the write data and the flash memory array and executes a verify process between the neighbor cell data and the flash memory array, and applies a program pulse to a memory cell corresponding to a bit at which the verify process has failed. In this manner, by executing a verify process, taking states of neighbor cell(s) into consideration, in addition to a conventional verify process, an influence of the neighbor cell effect can be eliminated, thereby making it possible to improve the reliability of a flash memory.

The flash memory of the present invention may execute a first program verify process or a second program verify process. In the first program verify process, the control circuit writes a pass value indicating no requirement of a program process and a fail value indicating requirement of a program process to the write buffer based on the input write data; copies data stored in the write buffer into the neighbor cell buffer; executes a logical operation between memory cells connected to the same word line, an offset therebetween being smaller than or equal to a predetermined number n (where n is a positive integer), based on data stored in the neighbor cell buffer, and data read from the flash memory array while applying a read voltage to the word line; writes a resultant pass or fail value as the neighbor cell data to the neighbor cell buffer; executes a logical operation based on data stored in the write buffer, and data read from the flash memory array while applying a first verify voltage to the word line; writes a resultant pass or fail value to the write buffer; executes a logical operation based on data stored in the neighbor cell buffer, and data read from the flash memory array while applying to the word line a second verify voltage which is different from the first verify voltage; writes a resultant pass or fail value to the neighbor cell buffer; and when the fail value is included in data stored in the write buffer or the neighbor cell buffer, applies a program pulse to a corresponding memory cell.

As described above, in the first program verify process, a result of the logical operation between the memory cells having an offset which is smaller than or equal to the predetermined number n is obtained as neighbor cell data, and a program verify process is executed between the neighbor cell data and the flash memory array while applying to the word line a verify voltage which is different from an ordinary voltage. In this case, when data indicating memory cell(s) for which an influence of the neighbor cell effect should be taken into consideration is obtained as neighbor cell data and a program verify process is executed between the neighbor cell data and the flash memory array, a verify voltage which is higher than an ordinary one is preferably used (the same effect is also obtained by applying a voltage which is lower than ordinary to a word line connected to a reference cell when the reference cell is used to generate a reference cell current). Thereby, it is possible to compensate for a cell current flowing over into neighbor cell(s) in a verify process to eliminate an influence of the neighbor cell effect. Therefore, it is possible to obtain a flash memory in which the threshold of a memory cell in the programmed state can be controlled with high accuracy and which has a large read margin and high reliability.

In the first program verify process, the control circuit may write a fail value to each bit of the neighbor cell data when a corresponding bit in data stored in the write buffer has the fail value and all data read from memory cell(s) which are connected to a read bit line side of the same word line as that of a memory cell into which the bit is to be written and have an offset of the predetermined number n or less from the memory cell into which the bit is to be written, are in the erased state, and when otherwise, writes the pass value thereto. Thereby, it is possible to simply obtain memory cell(s) for which an influence of the neighbor cell effect should be taken into consideration.

When the data read from the flash memory array while applying the first verify voltage to the word line is in the programmed state, the control circuit may update a corresponding bit in data stored in the write buffer to have the pass value. When the data read from the flash memory array while applying the second verify voltage to the word line is in the programmed state, the control circuit may update a corresponding bit in data stored in the neighbor cell buffer to have the pass value. Thereby, a program pulse is no longer applied to a memory cell which has once been determined to pass in a verify process. Therefore, a program pulse is prevented from being applied to a memory cell located on a boundary between pass and fail to an extent more than necessary. Therefore, it is possible to prevent the threshold of a memory cell in the programmed state from being increased more than necessary, resulting in an improvement in the reliability of a memory cell.

The second verify voltage may be higher than the first verify voltage. As a result, when a memory cell for which an influence of the neighbor cell effect should be taken into consideration is verified, a cell current flowing over into neighbor cell(s) is compensated for by an increase in the potential of a word line, thereby making it possible to eliminate an influence of the neighbor cell effect. The same effect is also obtained by applying a voltage which is lower than ordinary to a word line connected to a reference cell when the reference cell is used to generate a reference cell current The predetermined number n may be 7 or less, and may practically be 3. When the predetermined number n is 3, the control circuit writes the fail value to each bit of the neighbor cell data when a corresponding bit in data stored in the write buffer has the fail value and all data read from memory cells which are connected to a read bit line side of the same word line as that of a memory cell into which the bit is to be written and have an offset of 3 or less from the memory cell into which the bit is to be written, are in the erased state, and when otherwise, writes the pass value thereto. When the data read from the flash memory array while applying the first verify voltage to the word line is in the programmed state, the control circuit updates a corresponding bit in data stored in the write buffer to have the pass value. When the data read from the flash memory array while applying the second verify voltage to the word line is in the programmed state, the control circuit updates a corresponding bit in data stored in the neighbor cell buffer to have the pass value. The second verify voltage is set to be higher than the first verify voltage. Thereby, it is possible to eliminate an influence of the neighbor cell effect to an extent which does not raise a practical problem.

In the second program verify process, the control circuit may write a pass value indicating no requirement of a program process and a fail value indicating requirement of a program process into the write buffer based on the input write data, and may execute an i-th program process where i is an integer of 0 or more and a predetermined number n or less (where n is a positive integer). In the i-th program process, the control circuit copies data stored in the write buffer into the neighbor cell buffer; based on data stored in the neighbor cell buffer and data read from the flash memory array while applying a read voltage to the word line, executes a logical operation between memory cells which are connected to the same word line and have an offset of i or less, except when i is 0; writes a resultant pass or fail value as the neighbor cell data to the neighbor cell buffer; based on data stored in the neighbor cell buffer and data read from the flash memory array while applying an i-th verify voltage to the word line, executes a logical operation; writes a resultant pass or fail value to the neighbor cell buffer; and when the fail value is included in data stored in the neighbor cell buffer, applies a program pulse to a corresponding memory cell.

As described above, in the i-th program process of the second program verify process, a result of a logical operation executed between memory cells having an offset of i or less is obtained as neighbor cell data, and a program verify process is executed between the neighbor cell data and the flash memory array using an i-th verify voltage. In this case, as the neighbor cell data, data indicating memory cells for which an influence of the neighbor cell effect should be taken into consideration is obtained in a stepwise manner. When a program verify process is executed between the neighbor cell data and the flash memory array, a verify voltage which can eliminate an influence of the neighbor cell effect is preferably used. Thus, by switching verify voltages in a stepwise manner, depending on the states of neighbor cell(s), a cell current flowing over into neighbor cell(s) in a verify process can be compensated for with high accuracy, thereby making it possible to eliminate an influence of the neighbor cell effect with high accuracy.

In the i-th program process of the second program verify process, the control circuit writes the fail value to each bit of the neighbor cell data when a corresponding bit in data stored in the write buffer has the fail value and all data read from memory cell(s) which are connected to a read bit line side of the same word line as that of a memory cell into which the bit is to be written and have an offset of i or less from the memory cell into which the bit is to be written, are in the erased state, and when otherwise, writes the pass value thereto. Thereby, it is possible to simply obtain data which categorizes memory cells, depending on a degree of an influence of the neighbor cell effect.

Also in the i-th program process, the control circuit may updates the corresponding bit in data stored in the neighbor cell buffer to have the pass value when the data read from the flash memory array while applying the i-th verify voltage to the word line is in the programmed state. Thereby, a program pulse is no longer applied to a memory cell which has once been determined to pass in a verify process. Therefore, a program pulse is prevented from being applied to a memory cell located on a boundary between pass and fail to an extent more than necessary. Therefore, it is possible to prevent the threshold of a memory cell in the programmed state from being increased more than necessary, resulting in an improvement in the reliability of a memory cell.

The i-th verify voltage may be higher than or equal to an (i−1)-th verify voltage, except when i is 0. Thereby, in a verify process, a cell current flowing over into neighbor cell(s) is compensated for by an increase in the potential of a word line, depending on a degree of an influence of the neighbor cell effect, thereby making it possible to eliminate an influence of the neighbor cell effect.

The control circuit may switch the i-th verify voltage into a plurality of values during execution of the i-th program process. Thereby, a cell current flowing over into neighbor cell(s) is compensated for with higher accuracy.

The predetermined number n may be 7 or less, and may practically be 3. When the predetermined number n is 3, in the i-th program process the control circuit writes the fail value to each bit of the neighbor cell data when a corresponding bit in data stored in the write buffer has the fail value and all data read from memory cell(s) which are connected to a read bit line side of the same word line as that of a memory cell into which the bit is to be written and have an offset of 3 or less from the memory cell into which the bit is to be written, are in the erased state, and when otherwise, writes the pass value thereto. When data read from the flash memory array while applying the i-th verify voltage to the word line is in the programmed state, the control circuit updates a corresponding bit in data stored in the neighbor cell buffer to have the pass value. When the i-th verify voltage is higher than or equal to an (i−1)-th verify voltage when i is 1 or more and 3 or less. Thereby, it is possible to eliminate an influence of the neighbor cell effect to an extent which does not raise a practical problem.

Alternatively, the neighbor cell buffer may have a capacity two or more times larger than that of the write buffer. When the neighbor cell data is being calculated, for a bit in data stored in the write buffer, two or more pieces of data read from memory cells which are connected to the same word line as that of a memory cell to which the bit is to be written and have an offset of a predetermined number n or less (where n is a positive integer), may be stored simultaneously. Thus, the neighbor cell buffer simultaneously stores a plurality of neighbor cell states, thereby making it possible to reduce the number of times of reading neighbor cell(s) and shorten the processing time.

The write buffer and the neighbor cell buffer may be each composed of registers. Thereby, when a buffer having a small capacity of about several words is sufficient, the chip area of a flash memory can be reduced. Further, by executing high-speed access to the register, a processing time can be reduced.

The write buffer and the neighbor cell buffer may be composed of an SRAM. Thereby, a large-capacity buffer can be achieved with a small area.

The write buffer and the neighbor cell buffer may be composed of a single memory which includes both of them. Thereby, the chip area of a flash memory can be reduced, though the processing time is increased.

The write buffer and the neighbor cell buffer may be composed of a plurality of memories which operate independently. Thereby, it is possible to access the write buffer and the neighbor cell buffer simultaneously, resulting in a reduction in processing time.

The write buffer and the neighbor cell buffer may be composed of a plurality of memories including a first area used as the write buffer and a second area used as the neighbor cell buffer. The second area included in one memory may be associated with the first area included in another memory. Thereby, it is possible to access the write buffer and the neighbor cell buffer simultaneously, so that data can be copied quickly from the write buffer to the neighbor cell buffer, resulting in a reduction in processing time.

A one-time amount of the write data to the flash memory array may be written into memory cells which are located at a distance of more than predetermined number n (where n is a positive integer, for example, 3) of memory cells in the word line direction from each other in the flash memory array. Thereby, states of neighbor cell(s) having an offset of n or less are not changed during a time when a program verify process is executed to the flash memory array. Therefore, it is not necessary to monitor whether or not the states of the neighbor cell(s) is changed. Therefore, a simple neighbor cell state analyzing algorithm can be used to correctly eliminate an influence of the neighbor cell effect. In addition, the number of times of updating the neighbor cell buffer is reduced, thereby making it possible to reduce a processing time.

The control circuit may include: a logical/physical address translator which converts a logical Y address which is used when selecting the bit line in the flash memory array, to a physical Y address corresponding to a physical location of a memory cell in the flash memory array; an adder-subtractor which executes addition or subtraction based on the physical Y address and a given offset to obtain an offset-added physical Y address; and a physical/logical address translator which converts the offset-added physical Y address to an offset-added logical Y address. The control circuit shifts data read from the flash memory array when an overflow or an underflow occurs. Thereby, it is possible to simply obtain an address of a neighbor cell having an arbitrary offset and simply access the neighbor cell in the flash memory array, resulting in a reduction in processing time.

A program verify method for a flash memory of the present invention is executed by a flash memory which comprises: a flash memory array including memory cells, a word line, and a bit line shared by memory cells neighboring each other in a direction of the word line; a write buffer functioning as a buffer for write data to the flash memory array; a neighbor cell buffer having a capacity which is larger than or equal to that of the write buffer; and a control circuit executing a program verify process with respect to the flash memory array. The program verify method comprises: writing the input write data to the write buffer; executing a logical operation based on the write data and data read from the flash memory array; writing an obtained result as neighbor cell data to the neighbor cell buffer; executing a verify process between the write data and the flash memory array and executing a verify process between the neighbor cell data and the flash memory array; and applying a program pulse to a memory cell corresponding to a bit at which the verify process has failed. In this manner, by executing a verify process, taking states of neighbor cell(s) into consideration, in addition to a conventional verify process, an influence of the neighbor cell effect can be eliminated, thereby making it possible to improve the reliability of a flash memory.

The program verify method of the present invention may be a first program verify method or a second program verify method. In the first program verify method, writing the write data includes writing a pass value indicating no requirement of a program process and a fail value indicating requirement of a program process to the write buffer based on the input write data. Writing the neighbor cell data includes copying data stored in the write buffer into the neighbor cell buffer, executing a logical operation between memory cells connected to the same word line, an offset therebetween being smaller than or equal to a predetermined number n (where n is a positive integer), based on data stored in the neighbor cell buffer, and data read from the flash memory array while applying a read voltage to the word line, and writing a resultant pass or fail value as the neighbor cell data to the neighbor cell buffer. Executing the verify process includes executing a logical operation based on data stored in the write buffer, and data read from the flash memory array while applying a first verify voltage to the word line, and writing a resultant pass or fail value to the write buffer, and executing a logical operation based on data stored in the neighbor cell buffer, and data read from the flash memory array while applying to the word line a second verify voltage which is different from the first verify voltage, and writing a resultant pass or fail value to the neighbor cell buffer. Applying the program pulse includes, when the fail value is included in data stored in the write buffer or the neighbor cell buffer, applying a program pulse to a corresponding memory cell.

Particularly, each bit of the neighbor cell data may be set to have the fail value when a corresponding bit in data stored in the write buffer has the fail value and all data read from memory cell(s) which are connected to a read bit line side of the same word line as that of a memory cell into which the bit is to be written and have an offset of the predetermined number n or less from the memory cell into which the bit is to be written, are in the erased state, and when otherwise, may be set to have the pass value.

The second program verify method may include executing an i-th program process where i is an integer of 0 or more and a predetermined number n or less (where n is a positive integer) as writing the neighbor cell data, executing the verify process and applying the program pulse. Writing the write data may include writing a pass value indicating no requirement of a program process and a fail value indicating requirement of a program process into the write buffer based on the input write data. Executing the i-th program process includes copying data stored in the write buffer into the neighbor cell buffer; based on data stored in the neighbor cell buffer and data read from the flash memory array while applying a read voltage to the word line, executing a logical operation between memory cells which are connected to the same word line and have an offset of i or less, except when i is 0, and writing a resultant pass or fail value as the neighbor cell data to the neighbor cell buffer; based on data stored in the neighbor cell buffer and data read from the flash memory array while applying the i-th verify voltage to the word line, executing a logical operation, and writing a resultant pass or fail value to the neighbor cell buffer; and when the fail value is included in data stored in the neighbor cell buffer, applying a program pulse to a corresponding memory cell.

Particularly, in executing the i-th program process, each bit of the neighbor cell data may be set to have the fail value when a corresponding bit in data stored in the write buffer has the fail value and all data read from memory cell(s) which are connected to a read bit line side of the same word line as that of a memory cell into which the bit is to be written and have an offset of i or less from the memory cell into which the bit is to be written, are in the erased state, and when otherwise, may be set to have the pass value.

Thus, according to the flash memory and the flash memory verifying method of the present invention, neighbor cell data indicating memory cell(s) for which an influence of the neighbor cell effect should be taken into consideration is obtained based on states of neighbor cell(s), and a verify process which takes the states of the neighbor cell (s) into consideration is executed in addition to an ordinary verify process. Therefore, it is possible to eliminate an influence of the neighbor cell effect, resulting in an increase in the reliability of a flash memory.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 8A to 8E are logic tables showing a method of updating a write buffer and a neighbor cell buffer in the program verify process of FIG. 7;

FIG. 10 is a table showing a relationship between states of neighbor cells and verify levels in the program verify process of FIG. 9.

DESCRIPTION OF THE PREFERRED EMBODIMENTS

Hereinafter, a flash memory and a program verify method thereof according to an embodiment of the present invention will be described with reference to the accompanying drawings. Particularly, a hardware structure, a neighbor cell effect and measures thereagainst, structures of a write buffer and a neighbor cell buffer, an offset addition process, a first program verify process, and a second program verify process, will be described in this order.

(Hardware Structure)

Figure 1:
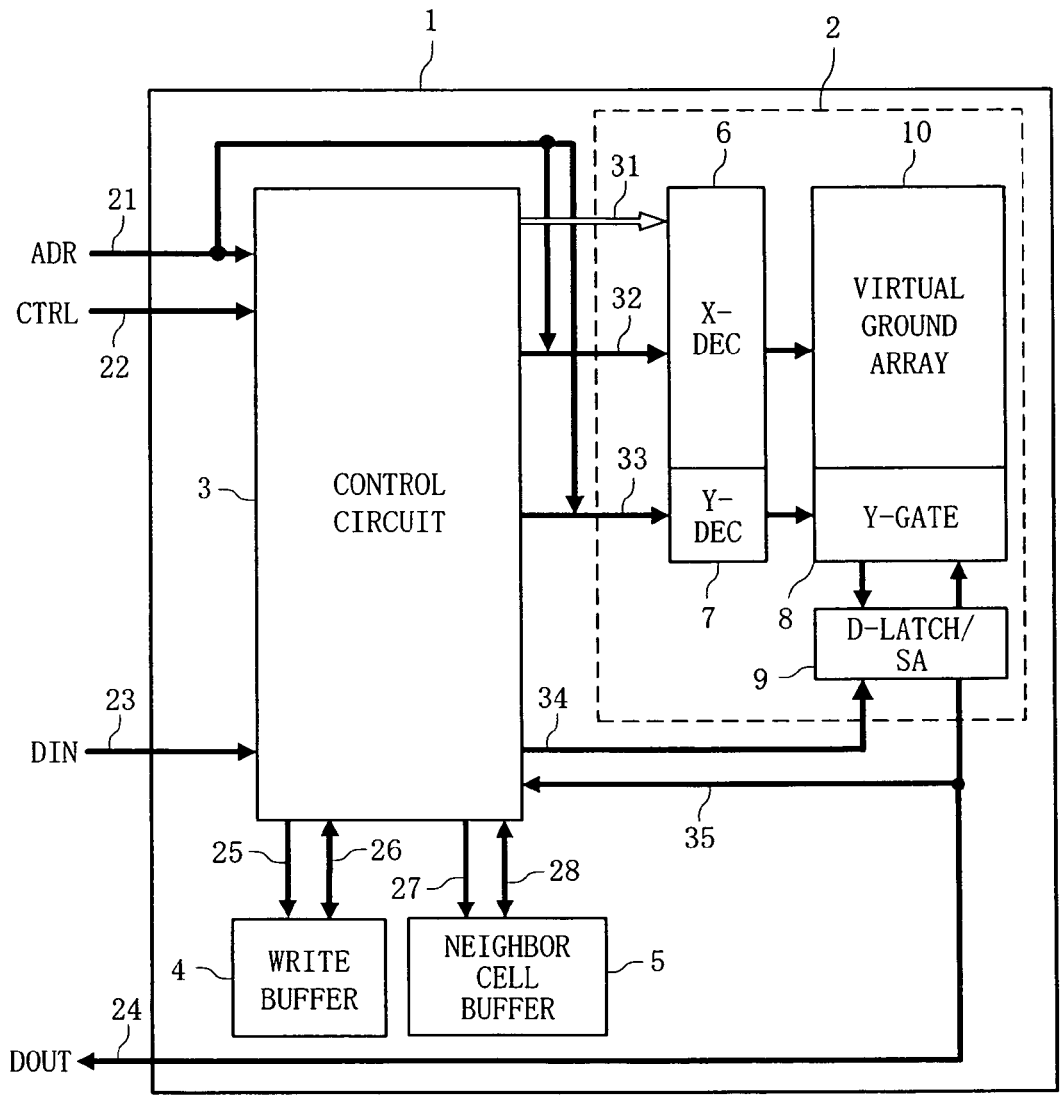
FIG. 1 is a block diagram of a flash memory according to an embodiment of the present invention.

FIG. 1 is a block diagram of a flash memory according to an embodiment of the present invention. The flash memory 1 of FIG. 1 comprises a flash memory array 2, a control circuit 3, a write buffer 4, and a neighbor cell buffer 5. The flash memory array 2 includes an X decoder 6, a Y decoder 7, a Y gate 8, a data latch/sense amplifier 9, and a virtual ground array 10.

The virtual ground array 10 includes memory cells, word lines and bit lines which are arranged in a two-dimensional manner (described in detail below). The X decoder 6 selects a word line in the virtual ground array 10 based on an X address 32 output from the control circuit 3. Thereby, a word line voltage 31 output from the control circuit 3 is applied to the selected word line. The Y decoder 7 determines a bit line to be selected, based on a Y address 33 output from the control circuit 3. The Y gate 8 selects a bit line of the virtual ground array 10 in accordance with the determination in the Y decoder 7. Data write and read processes with respect to a memory cell in the virtual ground array 10 are executed via the Y gate 8. The data latch/sense amplifier 9 is connected to the Y gate 8, and has a function of holding data and a function of comparing a cell current with a reference cell current in a read process.

Data to be written into the flash memory array 2 (hereinafter referred to as user data) is externally input via a data input 23. The control circuit 3 executes a program verify process with respect to the virtual ground array 10, taking states of neighbor cell(s) into consideration (described in detail below). In this case, the control circuit 3 executes a logical operation with respect to user data stored in the write buffer 4 and data read from the virtual ground array 10 to obtain data about the states of the neighbor cell(s) (hereinafter referred to as neighbor cell data). The write buffer 4 functions as a buffer for externally input user data. The neighbor cell buffer 5 is a buffer which has a capacity larger than or equal to that of the write buffer 4 and stores neighbor cell data obtained by the control circuit 3. Note that the control circuit 3 executes a program verify process using a microcontroller incorporated thereinto. Thereby, contents of a program verify process can be changed, depending on the specification of the flash memory 1 (e.g., access speed, reliability, etc.).

Figure 2:
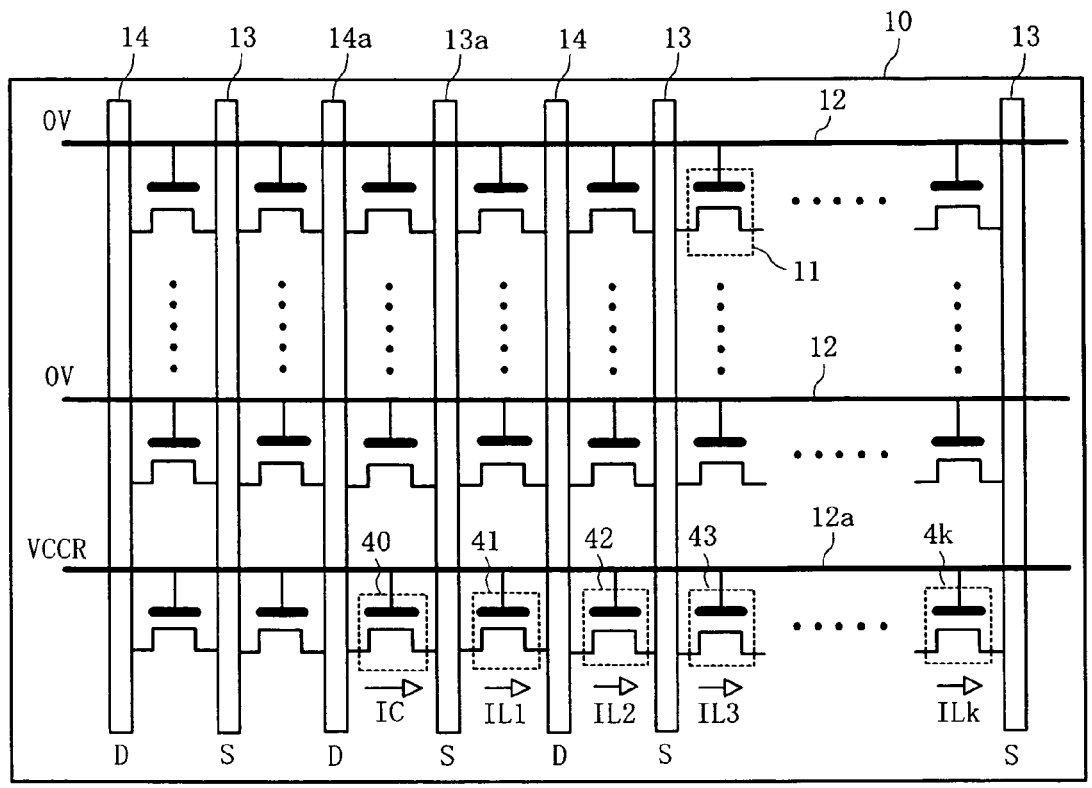
FIG. 2 is a diagram showing a detailed structure of a virtual ground array in the flash memory of FIG. 1.

FIG. 2 is a diagram showing a detailed structure of the virtual ground array 10. As shown in FIG. 2, the virtual ground array 10 includes NROM type memory cells 11, word lines 12, and diffused bit lines 13 and 14, which are arranged in a two-dimensional manner. The gate of the memory cell 11 is connected to the word line 12, the source thereof is connected to the diffused bit line 13, and the drain thereof is connected to the diffused bit line 14. The diffused bit line 13 functions as a source-side bit line (read bit line), while the diffused bit line 14 functions as a drain-side bit line. The gates of the memory cells 11 which are provided on the same row are connected to the same word line 12. The sources of the memory cells 11 which are provided on the same column are connected to the same diffused bit line 13. The drains of the memory cell 11 which are provided on the same column are connected to the same diffused bit line 14. The memory cells 11 neighboring each other in a row direction are connected to the same diffused bit line 13, 14. Thus, the memory cells 11 neighboring each other in a word line direction share a bit line.

The memory cell 11 is an NROM type memory cell composed of an N-channel transistor. When a pulse having a predetermined voltage level is applied to the drain-side diffused bit line 13 while applying a voltage having a predetermined level to a word line, a threshold of the memory cell 11 is changed (note that, in this case, the drain and source are determined based on a voltage level in a read process). Therefore, by externally applying a predetermined pulse, a state of the memory cell 11 can be transitioned between a programmed state (high threshold state) and an erased state (low threshold state). The programmed state and the erased state are associated with a 0-storing state and a 1-storing state, respectively.

(Neighbor Cell Effect and Measures Thereagainst)

A neighbor cell effect which occurs in the virtual ground array 10 will be described with reference to FIGS. 2 and 3. It is here assumed that, for example, a source-side read process is executed with respect to a memory cell 40 in the virtual ground array 10. In this case, before selecting the memory cell 40, all the diffused bit lines 13 and 14 are temporarily connected to a ground potential, and thereafter, are controlled to go to a high impedance state. A predetermined gate bias VCCR is applied to a word line 12a which is connected to the gate of the memory cell 40, while 0 V is applied to the other word lines 12. A read drain bias (e.g., about 2 V) is applied to a drain-side diffused bit line 14a of the memory cell 40. A source-side diffused bit line 13a of the memory cell 40 is connected to a sense amplifier (not shown).

Neighbor cells 41 to 4k are neighbor cells which are located at an offset of 1 to k from the memory cell 40, respectively. When a source-side read process is executed with respect to the memory cell 40, a portion of a cell current IC of the memory cell 40 flows over into the neighbor cells 41 to 4k. Amounts of currents flowing through the neighbor cells 41 to 4k vary depending on states of the neighbor cells 41 to 4k.

Figure 3:
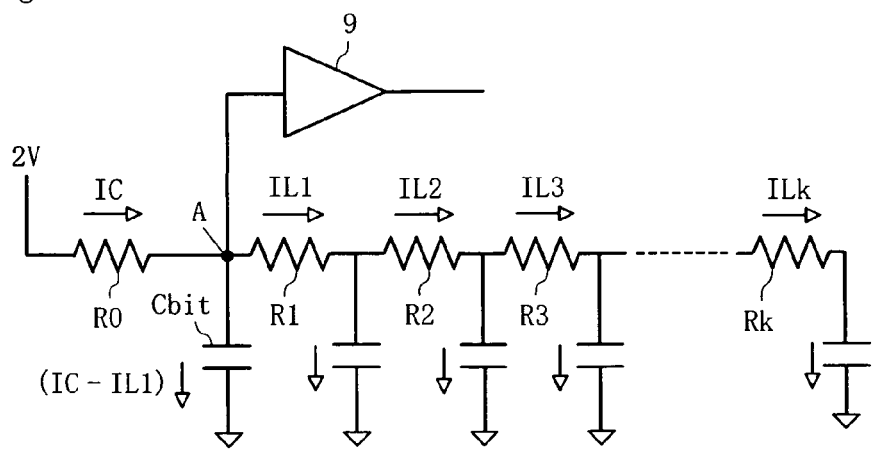
FIG. 3 is a diagram showing an equivalent circuit when a source-side read process is executed in the flash memory of FIG. 1.

FIG. 3 is a diagram showing an equivalent circuit when a source-side read process is executed in the memory cell 40. In FIG. 3, the memory cell 40 is replaced with a resistance R0, the neighbor cells 41 to 4k are replaced with the resistances R1 to Rk, and the diffused bit lines 13 and 14 are replaced with capacitances. A sense amplifier 9 is used to determine whether or not the memory cell 40 is in the programmed state or the erased state, based on a potential Vbit of a point A when a capacitance Cbit corresponding to the source-side diffused bit line 13a is charged.

In this case, the capacitance Cbit is charged with a current (IC−IL1) which is the cell current IC of the memory cell 40 minus a leakage current IL1, but not with the entire cell current IC. The leakage current IL1 is a current which flows through an RC network corresponding to the neighbor cells 41 to 4k, and varies depending on values of the resistances R1 to Rk (the values are determined based on the states of the neighbor cells 41 to 4k). For example, when the leakage current IL1 is large, the capacitance Cbit is charged with a small amount of cell current, so that the potential Vbit which is obtained by integrating the cell current for a predetermined time is low. Therefore, the threshold of the memory cell 40 is apparently shifted toward a higher value by the amount of the leakage current IL1 when observed externally.

The values of the resistances R1 to Rk are small when the neighbor cells 41 to 4k are in the erased state, and are large when the neighbor cells 41 to 4k are in the programmed state. Therefore, when all of the neighbor cells 41 to 4k are in the erased state, the resistance value of the RC network corresponding to the neighbor cells 41 to 4k is minimum while the leakage current IL1 is maximum. When the neighbor cells having an offset of k or less are in the erased state and a neighbor cell having an offset of (k+1) is in the programmed state, the resistance value of the (k+1)th-offset neighbor cell is sufficiently larger than those of the other neighbor cells. Therefore, in this case, the states of neighbor cells having an offset of (k+2) or more have substantially no influence on the cell current.

When all of the neighbor cells having an offset of k or less are in the erased state, a neighbor cell having a larger offset has a smaller influence on a change in cell current. Therefore, when the neighbor cell effect is studied, only memory cell(s) having an offset of a predetermined number n or less (where n is an integer) are taken into consideration. It is empirically known that a neighbor cell having an influence on a change in cell current is limited to those having an offset of 7 or less. According to the result of an experiment performed by the present inventors, it is also known that neighbor cells having an offset of 3 or less only need to be taken into consideration. Thus, the predetermined number n is preferably 7 or less, and the predetermined number n of 3 is typically sufficient.

An influence of the neighbor cell effect on a program verify process will be hereinafter described. As described above, when the neighbor cell effect occurs, the threshold of a memory cell is apparently shifted toward a higher value when observed externally. Therefore, when a memory cell whose neighbor cell(s) are in the erased state is to be transitioned from the erased state to the programmed state, the memory cell is determined to be transitioned to the programmed state at a time when a smaller amount of hot electrons than ordinary have been injected to the memory cell. Therefore, the amount of hot electrons injected into the memory cell in the programmed state is small, leading to a deterioration in charge retention capability. When a neighbor cell is subsequently transitioned from the erased state to the programmed state, an influence of the neighbor cell effect is reduced, so that the threshold of the memory cell is decreased to an original value. Therefore, a read margin is reduced.

Therefore, in order to eliminate such an influence of the neighbor cell effect, a decrease in voltage due to the leakage current IL1 may be compensated for by overdriving a word line which is connected to a memory cell to be verified, in a program verify process (i.e., applying a higher voltage than ordinary). In this case, an overdrive amount D (a difference from a voltage in an ordinary case) can be determined using the following approximation expression (1):

$$IC(PVV) \approx IC(PVV+D) - IL1(PVV+D) \tag{1}$$

where IC(PVV) represents a cell current when a voltage PVV is applied in a program verify process, and IC(PVV+D) and IL1(PVV+D) represent a cell current and a leakage current to a 1st-offset neighbor cell, respectively, when an overdrive amount is assumed to be D.

Analysis using the above-described expression (1) may be performed to determine only one overdrive amount when a predetermined number n of consecutive neighbor cells are in the erased state where n is counted from the 1st-offset neighbor cell. According to this method, a word line can be overdriven simply by using one overdrive amount. Alternatively, analysis using the above-described expression (1) may be performed for all combinations of the states of neighbor cells and an overdrive amount D may be determined for each combination of neighbor cells. According to this method, a word line can be overdriven in a stepwise manner, depending on the states of neighbor cells using a plurality of overdrive amounts.

As described below, in the flash memory 1 of the embodiment, a verify process is executed between user data and the flash memory array 2, while a verify process is executed between neighbor cell data and the flash memory array 2. A higher voltage is applied to a word line of the virtual ground array 10 in the latter verify process than the former verify process. Thus, by executing a verify process while applying a high voltage to a word line, depending on the states of neighbor cell(s), a reduction in cell current is compensated for with an increase in the potential of the word line, thereby making it possible to eliminate an influence of the neighbor cell effect. Therefore, according to the flash memory 1, the amount of charges injected when causing a memory cell to transition from the erased state to the programmed state, can be controlled with high accuracy, thereby making it possible to improve a read margin and increase reliability. Note that, when a reference cell is used to generate a reference cell current and a differential amplifier is used to compare a cell current with the reference cell current, the same effect is obtained even if a voltage lower than ordinary is applied to a word line which is connected to the reference cell.

(Structures of Write Buffer and Neighbor Cell Buffer)

Features of a hardware structure of the flash memory 1 will be described before description of a program verify process in the flash memory 1. Firstly, the write buffer 4 and the neighbor cell buffer 5 will be described. A program process with respect to the virtual ground array 10 is executed where a certain amount which is lower than or equal to the capacity of the write buffer 4 (e.g., the same amount as, or a half amount of, the capacity of the write buffer 4, etc.) is a unit amount of the program process.

An address space of the write buffer 4 is mapped to a specified area of an address space of the virtual ground array 10. As described above, to eliminate an influence of the neighbor cell effect, neighbor cell(s) having an offset of a predetermined number n or less are taken into consideration. When the address space of the write buffer 4 is mapped to the address space of the virtual ground array 10, addresses of the write buffer 4 are associated with memory cells in the virtual ground array 10 which are located at a distance of more than the predetermined number n of memory cells in a word line direction from each other, by the Y decoder 7. In other words, user data which is written into the flash memory array 2 one time is written into memory cells which are located at a distance of more than the predetermined number n of memory cells in the word line direction from each other in the virtual ground array 10. Thereby, when a certain memory cell M is transitioned from the erased state to the programmed state, it is possible to guarantee that the states of neighbor cell(s) having an offset of n or less with respect to the memory cell M are not changed.

The neighbor cell buffer 5 stores neighbor cell data (data about the states of neighbor cell(s)) corresponding to user data stored in the write buffer 4. The neighbor cell buffer 5 may be a buffer which has the same capacity as that of the write buffer 4. In this case, addresses of the neighbor cell buffer 5 are in one-to-one correspondence with addresses of the write buffer 4. The neighbor cell buffer 5 may have a capacity two or more times larger than that of the write buffer 4. In this case, the neighbor cell buffer 5, when neighbor cell data is calculated, stores a plurality of pieces of data read from neighbor cell(s) for each bit of the user data stored in the write buffer 4.

The write buffer 4 and the neighbor cell buffer 5 may be constructed with various methods. When a buffer capacity of as small as about several words is sufficient, the two buffers may be composed of registers, such as a latch, a flip-flop or the like. With this structure, it is possible to suppress an increase in chip area due to addition of the buffers. It is possible to access a register more quickly than a non-volatile memory, thereby making it possible to execute a program verify process quickly. When large buffer capacity is required, the two buffers may be composed of memory(s) (specifically, an SRAM). With this structure, a large-capacity buffer can be achieved with a relatively small area.

The two buffers are composed of a single memory. By using a single memory to achieve the write buffer 4 and the neighbor cell buffer 5, an increase in chip area due to addition of the buffers can be suppressed, though a time required to execute a program verify process is elongated.

Figure 4:
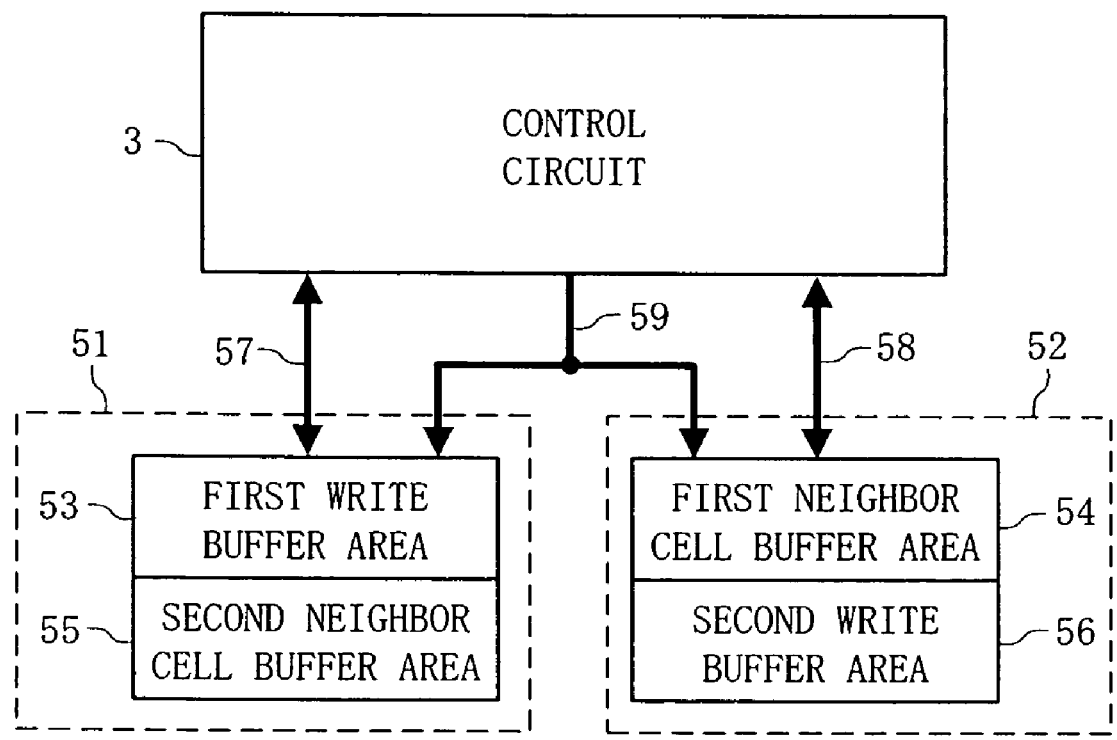
FIG. 4 is a diagram showing exemplary structures of a write buffer and a neighbor cell buffer in the flash memory of FIG. 1.

The two buffers may be composed of a plurality of memories which operate independently. In this case, the write buffer 4 may be composed of memory(s) which are different from those of the neighbor cell buffer 5. Alternatively, as shown in FIG. 4, two memories may be each provided with a write buffer area and a neighbor cell buffer area. In FIG. 4, a first memory 51 includes a first write buffer area 53 and a second neighbor cell buffer area 55. A second memory 52 includes a first neighbor cell buffer area 54 and a second write buffer area 56. The control circuit 3 accesses the first memory 51 using a first data bus 57 and a control/address signal 59, and accesses the second memory 52 using a second data bus 58 and the control/address signal 59. The first and second write buffer areas 53 and 56 are used as the write buffer 4, while the first and second neighbor cell buffer areas 54 and 55 are used as the neighbor cell buffer 5. The first neighbor cell buffer area 54 is used in association with the first write buffer area 53, while the second neighbor cell buffer area 55 is used in association with the second write buffer area 56.

As described above, in FIG. 4, the first and second neighbor cell buffer areas 54 and 55 are used in association with the first and second write buffer areas 53 and 56 included in another memory. Therefore, the control circuit 3 can access the first and second memories 51 and 52 simultaneously via the first and second data buses 57 and 58. Therefore, the control circuit 3 can copy user data from the write buffer area to the neighbor cell buffer area. A data transfer rate (band width) between the control circuit 3 and the write buffer 4 or the neighbor cell buffer 5 is two times higher than when the two buffers are composed of respective different memories. Thereby, a processing time required to eliminate an influence of the neighbor cell effect can be reduced, resulting in a high-speed program verify process.

(Offset Addition Process)

Next, an offset addition process in the control circuit 3 will be described. As described above, addresses of the write buffer 4 is associated with respective memory cells which are located at a distance of more than a predetermined number n of memory cells in the word line direction from each other in the virtual ground array 10. The association is performed using the Y decoder 7. Therefore, the control circuit 3 outputs an externally input address input 21 without modification as the X address 32 and the Y address 33. Hereinafter, an address output from the control circuit 3 to the Y decoder 7 is referred to as a logical Y address.

When accessing a neighbor cell Mk located at an offset of k from the memory cell M, the control circuit 3 needs to add the offset k to the logical Y address of the memory cell M to obtain the logical Y address of the neighbor cell Mk. Note that an offset needs to be added to a physical address corresponding to a physical location of a memory cell in the virtual ground array 10, but not to a logical address. Therefore, the control circuit 3 incorporates an offset adder 60 shown in FIG. 5 so as to add an offset to a logical Y address.

Figure 5:
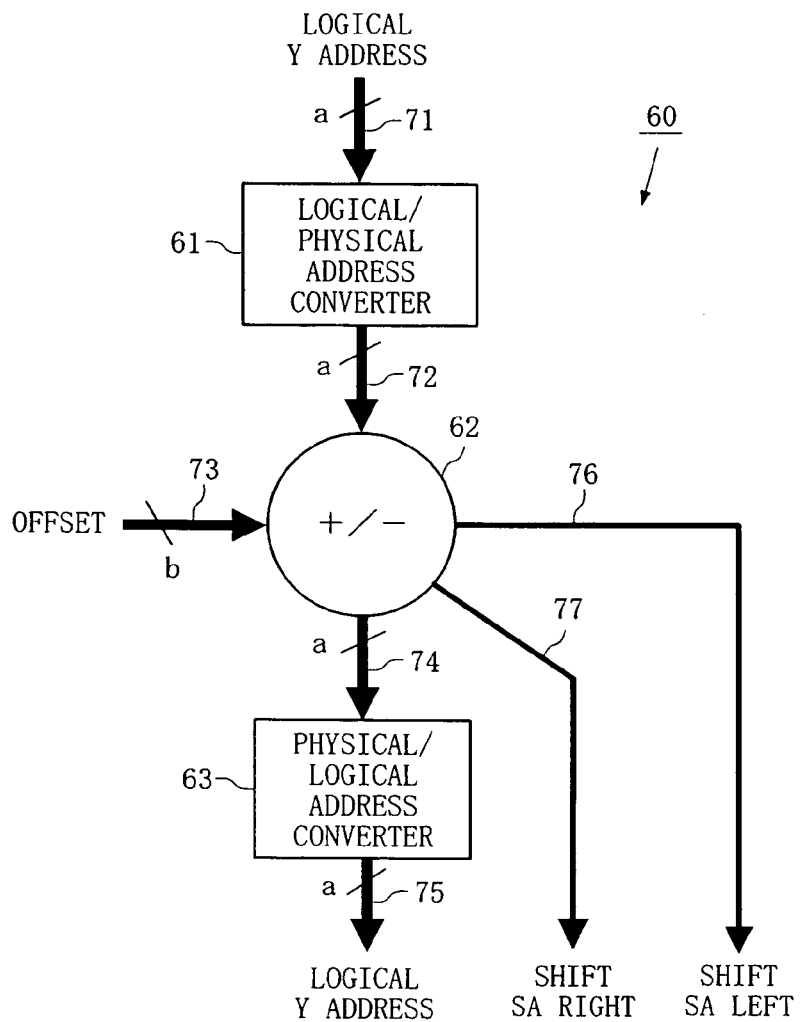
FIG. 5 is a diagram showing a structure of an offset adder included in the flash memory of FIG. 1.

The offset adder 60 of FIG. 5 includes a logical/physical address translator 61, an adder-subtractor 62, and a physical/logical address translator 63. The offset adder 60 adds a logical Y address 71 and an offset 73. The logical/physical address translator 61 converts an input a-bit logical Y address 71 to an a-bit physical Y address 72. The adder-subtractor 62 executes addition or subtraction with respect to the physical Y address 72 and an input b-bit offset 73 and outputs an a-bit physical Y address 74. More specifically, the adder-subtractor 62 adds the offset 73 to the physical Y address 72 when the physical Y address 72 is an even number, and subtracts the offset 73 from the physical Y address 72 when the physical Y address 72 is an odd number. The physical/logical address translator 63 converts the physical Y address 74 to an a-bit logical Y address 75.

The adder-subtractor 62 outputs an overflow signal 76 when an overflow occurs in the addition process. In this case, the control circuit 3 shifts an output signal of the sense amplifier 9 (i.e., data read from the flash memory array 2) by one bit to the left. The adder-subtractor 62 outputs an underflow signal 77 when underflow occurs in the subtraction process. In this case, the control circuit 3 shifts an output signal of the sense amplifier 9 by one bit to the right.

Figure 6:
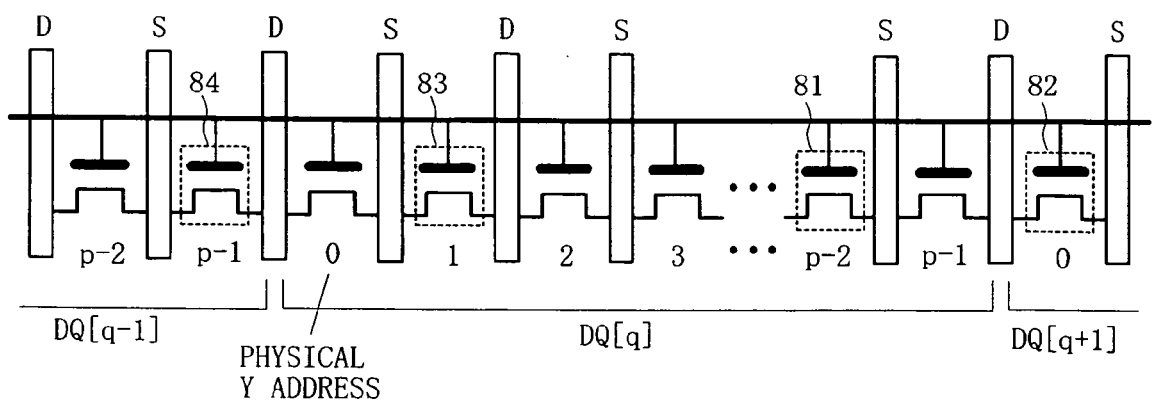
FIG. 6 is a reference diagram for explaining an operation of the offset adder included in the flash memory of FIG. 1.

A reason why the offset adder 60 is used to add an offset to a logical Y address will be described with reference to FIG. 6. FIG. 6 is a diagram showing how a plurality of memory cells are connected to a word line in the virtual ground array 10. In FIG. 6, cell currents flowing through respective p memory cells disposed in a word line direction are detected by the same sense amplifier. A symbol DQ[q] indicates a range of memory cells whose cell current is detected by a q-th sense amplifier.

As shown in FIG. 6, two diffused bit lines are connected to each memory cell. One of the two diffused bit lines functions as a drain-side bit line, while the other functions as a source-side bit line. Here, when each memory cell stores one-bit data, roles of the two diffused bit lines connected to a memory cell are fixedly determined, depending on whether the physical Y address of the memory cell is an even or odd number. Therefore, A side of the memory cell M on which a neighbor cell of the memory cell M is located is determined, depending on whether the physical Y address of the memory cell is an even or odd number. For example, in FIG. 6, for a memory cell having an even-numbered physical Y address, the right-side diffused bit line functions as a source-side bit line. Therefore, a neighbor cell of a memory cell having an even-numbered physical Y address is located on a right side of the memory cell (physical Y address increasing side). In contrast, a neighbor cell of a memory cell having an odd-numbered physical Y address is located on a left side of the memory cell (physical Y address decreasing side). For example, neighbor cells of a memory cell having a physical Y address of 0 have physical Y addresses of 1, 2, 3 and the like. Neighbor cells of a memory cell having a physical Y address of 3 have physical Y addresses of 2, 1, 0 and the like. Therefore, the adder-subtractor 62 executes addition when the physical Y address 72 is an even number and executes subtraction when the physical Y address 72 is an odd number.

As described above, the control circuit 3 shifts an output signal of the sense amplifier 9 by one bit to the left when an overflow occurs in the adder-subtractor 62, and shifts an output signal of the sense amplifier 9 by one bit to the right when underflow occurs in the adder-subtractor 62. For example, in FIG. 6, a neighbor cell having an offset of 2 from a memory cell 81 is a memory cell 82. In this case, a cell current of the memory cell 82 is detected by a (q+1)-th sense amplifier. Therefore, the control circuit 3 shifts an output signal of the sense amplifier 9 by one bit to the left. Thus, an output signal of the (q+1)-th sense amplifier can be handled as an output signal of a q-th sense amplifier, whereby the control circuit 3 can correctly process data read from a neighbor cell. A neighbor cell having an offset 2 from a memory cell 83 is a memory cell 84. In this case, a cell current of the memory cell 84 is detected by a (q−1)-th sense amplifier. Therefore, the control circuit 3 shifts an output signal of the sense amplifier 9 by one bit to the right. Thus, by handling an output signal of the (q−1)-th sense amplifier as an output signal of the q-th sense amplifier, the control circuit 3 can correctly process data read from a neighbor cell.

As shown in FIG. 6, a memory cell M and a neighbor cell M' of the memory cell M are connected to the same word line. Therefore, by using the offset adder 60 of FIG. 5 and the above-described shift mechanism, it is possible to easily read data from a neighbor cell having an arbitrary offset from an arbitrary memory cell in the virtual ground array 10. As a result, it is possible to reduce a processing time required to eliminate an influence of the neighbor cell effect, thereby executing a program verify process with high speed. Note that the function of the offset adder 60 may be implemented by a microcontroller incorporated in the control circuit 3 and software, depending on the specification of the flash memory 1. Even when each memory cell stores two-bit data, the roles of the drain and source of the memory cell are only exchanged. Therefore, an offset adder which is constructed in accordance with the same principle as that of the offset adder 60 of FIG. 5 can be used.

(First Program Verify Process)

Hereinafter, as program verify processes of the flash memory 1, a first program verify process which employs two verify voltages and a second program verify process which employs three or more verify voltages will be described. In the following description, it is assumed that the neighbor cell buffer 5 has the same capacity as that of the write buffer 4. Note that the flash memory 1 can use the same hardware to execute any of the first and second program verify processes by changing software which is executed by the microcontroller of the control circuit 3.

An outline of the first program verify process will be hereinafter described. In the first program verify process, externally input user data is written into the write buffer 4. Next, a predetermined logical operation is executed based on the user data stored in the write buffer 4 and data read from the virtual ground array 10 to obtain bit(s) of the user data which are to be verified, taking the neighbor cell effect into consideration. An obtained result is written as neighbor cell data to the neighbor cell buffer 5. Next, a verify process is executed using an ordinary verify voltage between the user data stored in the write buffer 4 and the virtual ground array 10. Next, a verify process is executed using a verify voltage higher than the ordinary one between the neighbor cell data stored in the neighbor cell buffer 5 and the virtual ground array 10. Next, a program pulse is applied to memory cell(s) for which the verify process has failed. The application of the program pulse is repeated until both the verify processes between the user data and the virtual ground array 10 and between the neighbor cell data and the virtual ground array 10 are successful for all bits of the user data and the neighbor cell data.

Figure 7:
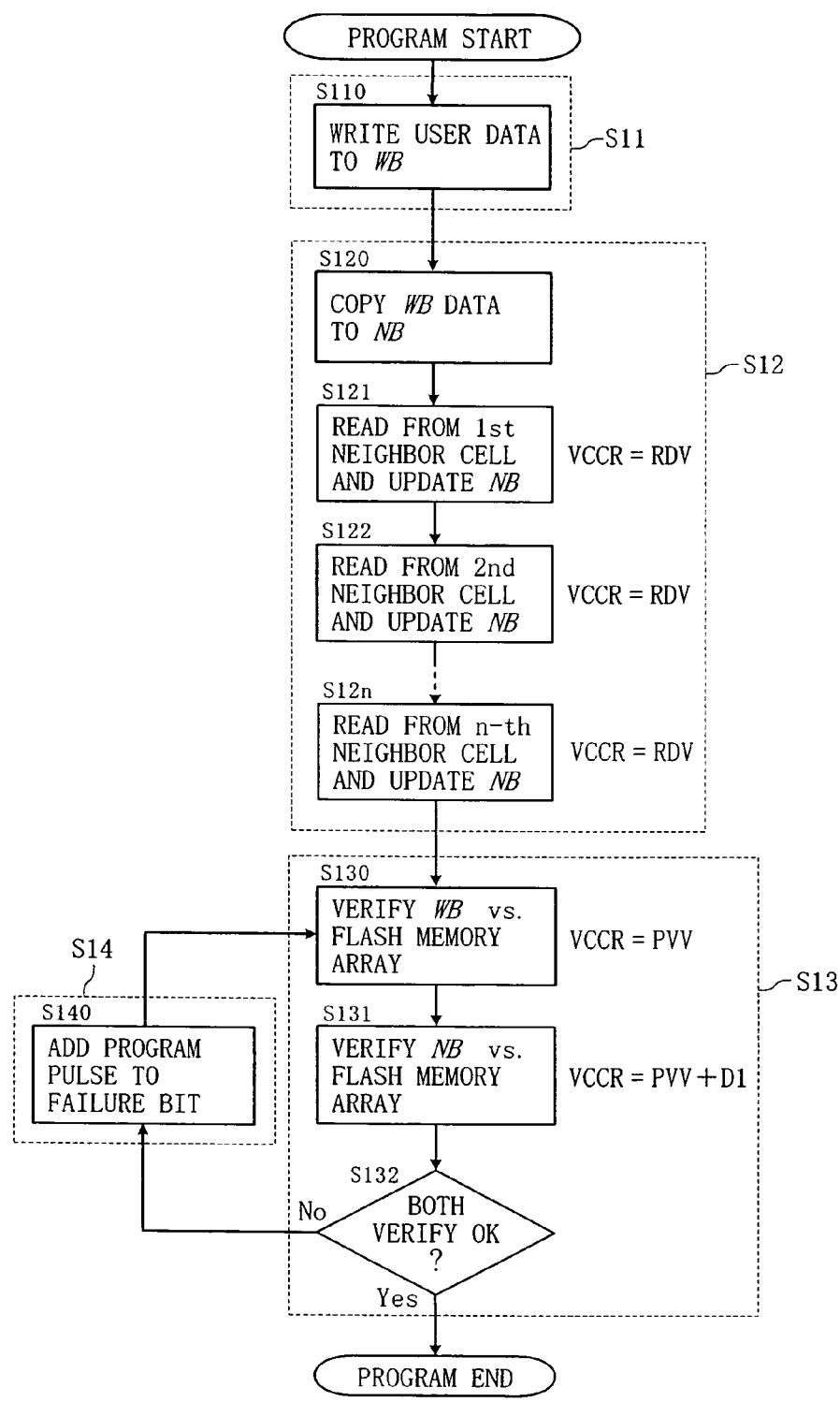
FIG. 7 is a flowchart showing a first program verify process in the flash memory of FIG. 1.

Hereinafter, the first program verify process will be described in detail with reference to FIG. 7 and FIGS. 8A to 8E. FIG. 7 is a flowchart showing the first program verify process. FIGS. 8A to 8E are logic tables showing a method of updating the write buffer 4 and the neighbor cell buffer 5 in the first program verify process. As shown in FIG. 7, in the first program verify process, a write buffer initializing step S11 and a neighbor cell buffer initializing step S12 are executed. Thereafter, a verifying step S13 and a program pulse applying step S14 are repeatedly executed until all verify processes are successfully executed. In FIG. 7 and FIGS. 8A to 8E, WB represents a write buffer, NB represents a neighbor cell buffer, SA represents an output signal of a sense amplifier, and X represents a value of either 0 or 1.

In the write buffer initializing step S11, the control circuit 3 writes externally input user data into the write buffer 4 (step S110). In step S110, user data is externally input to the flash memory 1 through the address input 21, a control input 22, and the data input 23. The control circuit 3 writes the input user data via an address bus 25 and a data bus 26 into the write buffer 4. Each bit of the user data is in a programmed state corresponding to a value of 0 or in an erased state corresponding to a value of 1. In the program verify process, a memory cell corresponding to a programmed-state bit needs to be subjected to a program process in the future, however, a memory cell corresponding to an erased-state bit no longer needs to be subjected to a program process. Therefore, a value of 0 which the control circuit 3 writes into the write buffer 4 is a fail value which indicates that a program process is required in the future. A value of 1 which the control circuit 3 writes into the write buffer 4 is a pass value which indicates that a program process is no longer required.

In the neighbor cell buffer initializing step S12, the control circuit 3 copies user data stored in the write buffer 4 to the neighbor cell buffer 5 (step S120). In step S120, the control circuit 3 reads and copies the user data stored in the write buffer 4 to the neighbor cell buffer 5 via an address bus 27 and a data bus 28. Thereby, each bit of data stored in the neighbor cell buffer 5 is updated as shown in FIG. 8A. Note that the control circuit 3 may write user data into the write buffer 4 and the neighbor cell buffer 5 simultaneously if there is no problem with a consumed current or the like. Thereby, a time required to execute a program verify process can be reduced.

Next, the control circuit 3 updates data stored in the neighbor cell buffer 5 by executing a process n times (steps S121 to S12n). Note that the number n is a maximum offset of a neighbor cell which should be taken into consideration in order to eliminate an influence of the neighbor cell effect. The number n is typically a positive integer of 7 or less (e.g., 3).

In step S121, for a bit B in data stored in the write buffer 4, the control circuit 3 reads data from a neighbor cell M1 (the first neighbor cell in FIG. 7) at an offset of 1 from a memory cell M to which the bit B is to be written. More specifically, the control circuit 3 outputs a portion of the address of the memory cell M as the X address 32 and outputs the logical Y address of the neighbor cell M1 which is obtained by the offset adder 60 (FIG. 5), as the Y address 33, and outputs a read voltage RDV which is used in an ordinary read process, as the word line voltage 31. Thereby, data stored in the neighbor cell M1 of the virtual ground array 10 is output as read data 35 via the sense amplifier 9.

In addition to this, in step S121, the control circuit 3 executes a logical operation shown in FIG. 8B based on data read from the neighbor cell M1 in the virtual ground array 10 (i.e., an output signal of the sense amplifier 9) and data stored in the neighbor cell buffer 5, and writes an obtained result into the neighbor cell buffer 5. According to FIG. 8B, a result of the logical operation becomes a pass value when the output signal of the sense amplifier 9 is in the programmed state (value: 0) or when data stored in the neighbor cell buffer 5 has a pass value (value: 1), and when otherwise, becomes a fail value (value: 0). Thereby, when the data read from the neighbor cell M1 is in the programmed state (value: 0), a bit B' which is in the data stored the neighbor cell buffer 5 and corresponds to the bit B is updated into a pass value (value: 1).

Next, in steps S122 to S12n, the control circuit 3 executes the same process as that which has been executed with respect to the neighbor cell M1, with respect to neighbor cells M2 to Mn (second to n-th neighbor cells in FIG. 7) which are located at an offset of 2 to n from the memory cell M to which the bit B is to be written. At a time when step S12n is completed, data stored in the neighbor cell buffer 5 becomes neighbor cell data. The bit B' in the neighbor cell data has a fail value (value: 0) when the corresponding bit B in data stored in the write buffer 4 is in the programmed state and all of the neighbor cells M1 to Mn located at an offset of 1 to n from the memory cell M to which the bit B is to be written are in the erased state, and when otherwise, has a pass value (value: 1). Therefore, when the bit B' in the neighbor cell data has the fail value, a cell current of the memory cell M to which the bit B is to be written can be said to be susceptible to an influence of the neighbor cell effect.

In the verifying step S13, the control circuit 3 executes a verify process between user data and the flash memory array 2 using an ordinary verify voltage (step S130), and executes a verify process between neighbor cell data and the flash memory array 2 using a verify voltage higher than the ordinary verify voltage (step S131). In step S130, for the bit B in data stored in the write buffer 4, the control circuit 3 reads data from the memory cell M to which the bit B is to be written. More specifically, the control circuit 3 outputs a portion of the address of the memory cell M as the X address 32, and outputs the remainder of the address of the memory cell M as the Y address 33, and outputs the first verify voltage PVV used in an ordinary program verify process, as the word line voltage 31. Thereby, data stored in a write destination memory cell in the virtual ground array 10 is output as the read data 35 via the sense amplifier 9.

In addition to this, in step S130, the control circuit 3 executes a logical operation shown in FIG. 8C based on data read from the memory cell M to which the bit B is to be written (i.e., an output signal of the sense amplifier 9) and data stored in the write buffer 4, and writes an obtained result into the write buffer 4. According to FIG. 8C, a result of the logical operation becomes a pass value (value: 1) when an output signal of the sense amplifier 9 is in the programmed state (value: 0) or data stored in the write buffer 4 has a pass value, and when otherwise, becomes a fail value (value: 0). Therefore, when data read from the write destination memory cell M while applying the first verify voltage PVV to a word line is in the programmed state (value: 0), the bit B in data stored in the write buffer 4 is updated to have a pass value (value: 1).

Next, in step S131, for the bit B' in data stored in the neighbor cell buffer 5, the control circuit 3 reads data from the write destination memory cell M corresponding to the bit B', as in step S130. Note that, in step S131, the control circuit 3 outputs a second verify voltage (PVV+D1) higher than the voltage used in the ordinary program verify process as the word line voltage 31, as is different from step S130. In this case, the overdrive amount D1 is determined using the above-described expression (1).

In addition to this, in step S131, the control circuit 3 executes a logical operation shown in FIG. 8D based on data read from the write destination memory cell M corresponding to the bit B' (i.e., an output signal of the sense amplifier 9) and data stored in the neighbor cell buffer 5, and writes an obtained result into the neighbor cell buffer 5. According to FIG. 8D, a result of the logical operation becomes a pass value (value: 1) when the output signal of the sense amplifier 9 is in the programmed state (value: 0) or when data stored in the neighbor cell buffer 5 has a pass value, and when otherwise, becomes a fail value (value: 0). Therefore, when data read from the write destination memory cell M while applying the second verify voltage (PVV+D1) to a word line is in the programmed state (value: 0), the bit B' in data stored in the neighbor cell buffer 5 is updated to have a pass value (value: 1).

Next, the control circuit 3 determines whether or not both the verify process in step S130 and the verify process in step S131 have been successful (step S132). In step S132, the control circuit 3 reads out data which has been used in the current program verify process, from the write buffer 4 and the neighbor cell buffer 5. When all the read data has a pass value (value: 1) ("Yes" in step S132), the control circuit 3 ends the program process. On the other hand, when the read data includes a fail value (value: 0) ("No" in step S132), the control circuit 3 goes to the program pulse applying step S14.

In the program pulse applying step S14, the control circuit 3 applies a program pulse to memory cell(s) corresponding to failure bit(s) among the memory cells included in the virtual ground array 10 (step S140). In step S140, the control circuit 3 outputs write data 34 in which bit(s) corresponding to memory cell(s) to which a program pulse are to be applied has a predetermined value (e.g., 0) and the other bit(s) have another predetermined value (e.g., 1). The data latch 9 latches the write data 34 in accordance with a control of the control circuit 3. Under this condition, the control circuit 3 applies a program pulse to the virtual ground array 10 using certain means (not shown).

As shown in FIG. 8E, in the verifying step S13 and the program pulse applying step S14, the control circuit 3 applies a program pulse to the memory cell M corresponding to the bit B when at least one of the bit B in data stored in the write buffer 4, and the bit B' which is in data stored in the neighbor cell buffer 5 and corresponds to the bit B, has a fail value (value: 0), and when otherwise, does not apply a program pulse to the memory cell M corresponding to the bit B.

After execution of the program pulse applying step S14, the control circuit 3 goes to step S130 in the verifying step S13. Therefore, the application of a program pulse in step S140 is repeated until both the verify process between user data and the flash memory array 2 and the verify process between neighbor cell data and the flash memory array 2 are successful for all bits of the user data and the neighbor cell data.

As described above, at a time when the first program verify process is ended, when a read process is executed with respect to a memory which is to be transitioned to the programmed state while applying the first verify voltage PVV to a word line, the read data is guaranteed to be in the programmed state (value: 0). Also, when a read process is executed with respect to a memory cell whose neighbor cells having an offset of 1 to n are all in the erased state (i.e., a memory cell susceptible to an influence of the neighbor cell effect), among memory cells which are to be transitioned to the programmed state, while applying the second verify voltage (PVV+D1) to a word line, the read data is guaranteed to be in the programmed state (value: 0).

As described above, in the first program verify process, by executing a logical operation between memory cells having an offset of a predetermined number n or less, data indicating memory cell(s) for which an influence of the neighbor cell effect should be taken into consideration (neighbor cell data) is obtained, and a program verify process is executed between the neighbor cell data and a flash memory array while applying a second verify voltage higher than an ordinary one to a word line. Thereby, a cell current flowing over to neighbor cell(s) in a verify process is compensated for, thereby making it possible to eliminate an influence of the neighbor cell effect. Therefore, the threshold of a memory cell in the programmed state can be controlled with high accuracy, resulting in a flash memory with a large read margin and a high level of reliability.

Further, a program pulse is no longer applied to a memory cell which has once been determined to pass in a verify process. Therefore, a program pulse is prevented from being applied to a memory cell located on a boundary between pass and fail to an extent more than necessary. Therefore, it is possible to prevent the threshold of a memory cell in the programmed state from being increased more than necessary, resulting in an improvement in the reliability of a memory cell. Furthermore, the neighbor cell buffer 5 having the same capacity as that of the write buffer 4 can be used to obtain the above-described neighbor cell data using a simple process.

(Second Program Verify Process)

Hereinafter, a second program verify process which employs three or more verify voltages in order to eliminate an influence of the neighbor cell effect with higher accuracy, will be described. In the first program verify process, the control circuit 3 executes a verify process between user data stored in the write buffer 4 and the virtual ground array 10, and executes a verify process between neighbor cell data stored in the neighbor cell buffer 5 and the virtual ground array 10. In the second program verify process, the control circuit 3 executes a verify process between user data and neighbor cell data both stored in the neighbor cell buffer 5, and the virtual ground array 10.

An outline of the second program verify process will be hereinafter described. In the second program verify process, externally input user data is written into the write buffer 4.

Next, for integers i of 0 or more and n or less, an i-th program process described below is executed successively. Note that the number n is a maximum value of an offset of a neighbor cell which should be taken into consideration in order to eliminate an influence of the neighbor cell effect. The number n is typically a positive integer of 7 or less (e.g., 3).

In the i-th program process, user data stored in the write buffer 4 is copied to the neighbor cell buffer 5. Next, a predetermined logical operation is performed based on the user data stored in the neighbor cell buffer 5 and data read from the virtual ground array 10, to obtain bit(s) which are to be subjected to a verify process, taking into a consideration the neighbor cell effect of neighbor cell(s) having an offset of i or less in the user data, except when i is 0. An obtained result is written as neighbor cell data into the neighbor cell buffer 5. Next, a verify process using an i-th verify voltage is executed between the neighbor cell data stored in the neighbor cell buffer 5 and the virtual ground array 10. As a 0-th verify voltage, an ordinary verify voltage is used. As the i-th verify voltage, a voltage which is higher than or equal to an (i−1)-th verify voltage is used. Next, a program pulse is applied to memory cell(s) corresponding to bit(s) for which a verify process has been failed. The application of a program pulse is repeated until the verify process between the neighbor cell data and the virtual ground array 10 is successful for all bits of the neighbor cell data.

Figure 9:
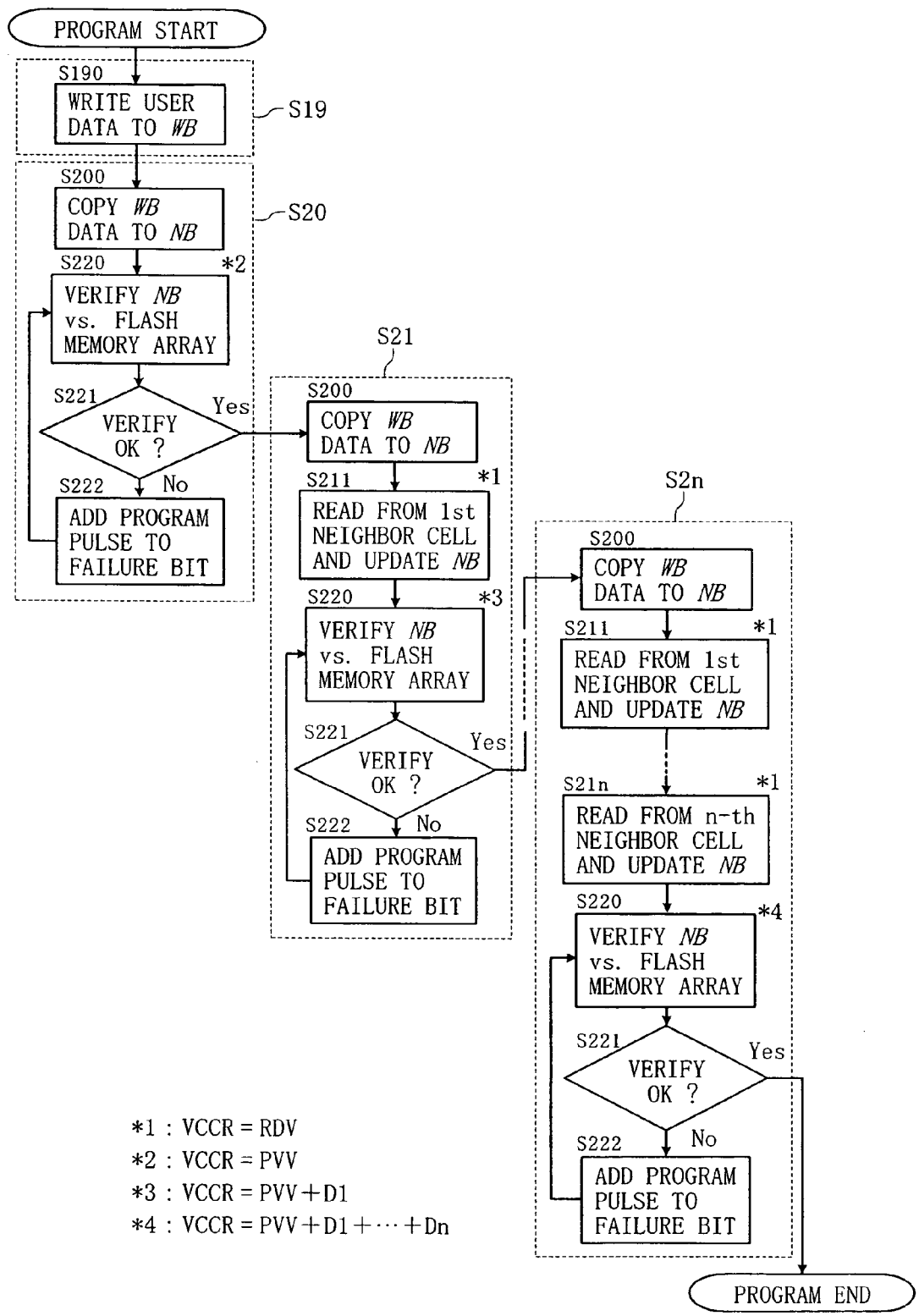
FIG. 9 is a flowchart showing a second program verify process in the flash memory of FIG. 1.

Hereinafter, the second program verify process will be described in detail with reference to FIGS. 9 and 10. In FIGS. 9 and 10, a nomenclature similar to that of FIGS. 7 and 8 is employed. FIG. 9 is a flowchart showing the second program verify process. As shown in FIG. 9, in the second program verify process, a write buffer initializing step S19 is executed before i-th program step(s) S2i are executed for i which is an integer of 0 or more and n or less.

In the write buffer initializing step S19, the control circuit 3 writes externally input user data into the write buffer 4 (step S190). In step S190, the same process as that of step S110 in the first program verify process is executed.

In the i-th program step S2i, the control circuit 3 copies user data stored in the write buffer 4 into the neighbor cell buffer 5 (step S200). In step S200, the same process as that of step S120 in the first program verify process is executed.

Next, the control circuit 3 updates data stored in the neighbor cell buffer 5 by executing a process i times (steps S211 to S21i), except when i is 0. In steps S211 to S21i, the same processes as those of steps S121 to S12n in the first program verify process are executed. Steps S211 to S21i will be hereinafter described in detail. The control circuit 3 reads data from a neighbor cell M1 located at an offset of 1 from a memory cell M to be written, while applying the ordinary read voltage RDV to a word line, and executes a logical operation shown in FIG. 8B based on the read data and data stored in the neighbor cell buffer 5, and writes an obtained result into the neighbor cell buffer 5 (step S211). Next, the control circuit 3 executes the same process as that which has been executed with respect to the neighbor cell M1, with respect to neighbor cells M2 to Mi located at an offset of 2 to i. At a time when step S21i is ended, data stored in the neighbor cell buffer 5 is neighbor cell data. A bit B' in the neighbor cell data becomes a fail value (value: 0) when a corresponding bit B in the user data stored in the write buffer 4 is in the programmed state and all of the neighbor cells M1 to Mi located at an offset of 1 to i from the memory cell M to which the bit B is to be written are in the erased state, and when otherwise, becomes a pass value (value: 1).

Next, the control circuit 3 executes a verify process between neighbor cell data stored in the neighbor cell buffer 5 and the virtual ground array 10 (step S220). In step S220, for the bit B' in data stored in the neighbor cell buffer 5, the control circuit 3 reads data from the write destination memory cell M corresponding to the bit B' as in step S131 in the first program verify process. Note that, in step S220 included in the i-th program step S2i, the control circuit 3 outputs the i-th verify voltage as the word line voltage 31.

Next, the control circuit 3 determines whether or not the verify process has been successful in step S220 (step S221) In step S221, the control circuit 3 reads data which has been used in the current program verify process, from the neighbor cell buffer 5. The control circuit 3 ends the i-th program step S2i when all read data has a pass value (value: 1) ("Yes" in step S221). In this case, the control circuit 3 goes to an (i+i)-th program step, or ends the program process. In contrast to this, when a fail value (value: 0) is included in the read data ("No" in step S221), the control circuit 3 goes to a program pulse applying step S222.

In the latter case, the control circuit 3 applies a program pulse to memory cell(s) corresponding to failure bit(s) among memory cells included in the virtual ground array 10 (step S222). In step S222, the same process as that of step S140 in the first program verify process is executed.

Here, the i-th verify voltage output as the word line voltage 31 in step S220 will be described. In step S220 of the 0-th program step S20, the verify voltage PVV which is used in an ordinary program verify process is output as a 0-th verify voltage. In step S220 of the i-th program step S2i, a voltage which is higher than or equal to an (i−1)-th verify voltage is output as the i-th verify voltage, except when i is 0. For example, in step S220 of the first program step S21, a voltage (PVV+D1) which is higher than or equal to the 0-th verify voltage PVV is output as a first verify voltage (where D1 is a value of 0 or more) In step S220 of the n-th program step S2n, a voltage (PVV+D1+ . . . +Dn) which is higher than or equal to an (n−1)-th verify voltage is output as an n-th verify voltage (where Dn is a value of 0 or more).

FIG. 10 is a diagram showing a relationship between states of neighbor cells and verify levels in the second program verify process. FIG. 10 shows a relationship between states of neighbor cells M1 to M3 located at an offset of 1 to 3 from a certain memory cell M and voltage levels (verify levels) used in a verify process executed with respect to the memory cell M, when the memory cell M is to be transitioned to the programmed state.

As shown in FIG. 10, when the neighbor cell M1 is in the programmed state, the verify level is a 0-th verify voltage PVV which is used in an ordinary program verify process. When the neighbor cell M1 is in the erased state and the neighbor cell M2 is in the programmed state, the verify level is a first verify voltage (PVV+D1) which is the 0-th verify voltage plus a value of D1. When the neighbor cells M1 and M2 are in the erased state and the neighbor cell M3 is in the programmed state, the verify level is a second verify voltage (PVV+D1+D2) which is the first verify voltage plus a value of D2. Similarly, when the neighbor cells M1 to M(n−1) are in the erased state and the neighbor cell Mn is in the programmed state, the verify level is an n-th verify voltage (PVV+D1+ . . . +Dn) which is an (n-1) verify level plus a value of Dn.

The values of D1 to Dn are determined using the above-described expression (1), for example. If all of the values of D1 to Dn are set to be positive values, all of the 0-th to n-th verify voltages have different values. Thereby, a verify level can be changed, depending on the number of consecutive neighbor cells in the erased state, thereby making it possible to eliminate an influence of the neighbor cell effect with high accuracy. Further, by setting one or more of the values of D1 to Dn to be 0, the number of verify levels can be reduced, so that verify levels can be simply generated. Furthermore, the control circuit 3 may switch the i-th verify voltage among a plurality of values during execution of the i-th program step S2$i$. Thereby, it is possible to further eliminate an influence of the neighbor cell effect with high accuracy.

Thus, at a time when the second program verify process is ended, when a read process is executed with respect to a memory cell whose 1st-offset neighbor cell is in the erased state among memory cell(s) to be transitioned to the programmed state, while applying the 0-th verify voltage PVV to a word line, the read data is guaranteed to be in the programmed state (value: 0). Also, when a read process is executed with respect to a memory cell whose 1st- to i-th-offset neighbor cells are all in the erased state among memory cell(s) to be transitioned to the programmed state, while applying the i-th verify voltage (PVV+D1+ . . . +Di) to a word line, the read data is guaranteed to be also in the programmed state (value: 0).

As described above, in the i-th program process of the second program verify process, by executing a logical operation between memory cell(s) having an offset of i or less, data indicating memory cell(s) for which an influence of the neighbor cell effect should be taken into consideration (neighbor cell data) can be obtained. A program verify process is executed using an i-th verify voltage between the neighbor cell data and a flash memory array. Thus, by switching a verify voltage in a stepwise manner, depending on the states of neighbor cell(s), it is possible to compensate for a cell current flowing over to neighbor cell(s) in a verify process with high accuracy, and eliminate an influence of the neighbor cell effect with high accuracy. Further, the neighbor cell buffer 5 having the same capacity as that of the write buffer 4 can be used to obtain the above-described neighbor cell data using a simple process.

According to the flash memory and the program verify method of the present invention, an influence of the neighbor cell effect which occurs in a memory array in which a bit line is shared by memory cells is eliminated, thereby improving a read margin and increasing reliability. Therefore, the flash memory and the program verify method of the present invention can be useful for a non-volatile memory, such as a flash memory which is constructed as a single chip, a flash memory incorporated in a semiconductor chip, and the like.

While the invention has been described in detail, the foregoing description is in all aspects illustrative and not restrictive. It is understood that numerous other modifications and variations can be devised without departing from the scope of the invention.

What is claimed is:

1. A flash memory having a program verify function, comprising:
   a flash memory array including memory cells, a word line, and a bit line shared by memory cells neighboring each other in a direction of the word line;
   a write buffer functioning as a buffer for write data to the flash memory array;
   a neighbor cell buffer having a capacity which is larger than or equal to that of the write buffer; and
   a control circuit executing a program verify process with respect to the flash memory array,
   wherein the control circuit writes the input write data to the write buffer,
   the control circuit executes a logical operation based on the write data and data read from the flash memory array, and writes an obtained result as neighbor cell data to the neighbor cell buffer,
   the control circuit executes a verify process between the write data and the flash memory array and executes a verify process between the neighbor cell data and the flash memory array, and
   the control circuit applies a program pulse to a memory cell corresponding to a bit at which the verify process has failed.

2. The flash memory according to claim 1, wherein:
   the control circuit writes a pass value indicating no requirement of a program process and a fail value indicating requirement of a program process to the write buffer based on the input write data;
   the control circuit copies data stored in the write buffer into the neighbor cell buffer;
   the control circuit executes a logical operation between memory cells connected to the same word line, an offset therebetween being smaller than or equal to a predetermined number n (where n is a positive integer), based on data stored in the neighbor cell buffer, and data read from the flash memory array while applying a read voltage to the word line, and writes a resultant pass or fail value as the neighbor cell data to the neighbor cell buffer;
   the control circuit executes a logical operation based on data stored in the write buffer, and data read from the flash memory array while applying a first verify voltage to the word line, and writes a resultant pass or fail value to the write buffer;
   the control circuit executes a logical operation based on data stored in the neighbor cell buffer, and data read from the flash memory array while applying to the word line a second verify voltage which is different from the first verify voltage, and writes a resultant pass or fail value to the neighbor cell buffer; and
   when the fail value is included in data stored in the write buffer or the neighbor cell buffer, the control circuit applies a program pulse to a corresponding memory cell.

3. The flash memory according to claim 2, wherein the control circuit writes the fail value to each bit of the neighbor cell data when a corresponding bit in data stored in the write buffer has the fail value and all data read from a memory cell or cells which are connected to a read bit line side of the same word line as that of a memory cell into which the bit is to be written and have an offset of the predetermined number n or less from the memory cell into which the bit is to be written, are in the erased state, and when otherwise, writes the pass value thereto.

4. The flash memory according to claim 2, wherein when the data read from the flash memory array while applying the first verify voltage to the word line is in the programmed state, the control circuit updates a corresponding bit in data stored in the write buffer to have the pass value, and
   when the data read from the flash memory array while applying the second verify voltage to the word line is in the programmed state, the control circuit updates a corresponding bit in data stored in the neighbor cell buffer to have the pass value.

5. The flash memory according to claim 2, wherein the second verify voltage is higher than the first verify voltage.

6. The flash memory according to claim 2, wherein the predetermined number n is 7 or less.

7. The flash memory according to claim 2, wherein the predetermined number n is 3, and
the control circuit writes the fail value to each bit of the neighbor cell data when a corresponding bit in data stored in the write buffer has the fail value and all data read from memory cells which are connected to a read bit line side of the same word line as that of a memory cell into which the bit is to be written and have an offset of 3 or less from the memory cell into which the bit is to be written, are in the erased state, and when otherwise, writes the pass value thereto,
when the data read from the flash memory array while applying the first verify voltage to the word line is in the programmed state, the control circuit updates a corresponding bit in data stored in the write buffer to have the pass value,
when the data read from the flash memory array while applying the second verify voltage to the word line is in the programmed state, the control circuit updates a corresponding bit in data stored in the neighbor cell buffer to have the pass value, and
the second verify voltage is higher than the first verify voltage.

8. The flash memory according to claim 1, wherein:
the control circuit writes a pass value indicating no requirement of a program process and a fail value indicating requirement of a program process into the write buffer based on the input write data, and
the control circuit executes an i-th program process where i is an integer of 0 or more and a predetermined number n or less (where n is a positive integer), and
in the i-th program process,
the control circuit copies data stored in the write buffer into the neighbor cell buffer,
based on data stored in the neighbor cell buffer and data read from the flash memory array while applying a read voltage to the word line, the control circuit executes a logical operation between memory cells which are connected to the same word line and have an offset of i or less, except when i is 0, and writes a resultant pass or fail value as the neighbor cell data to the neighbor cell buffer,
based on data stored in the neighbor cell buffer and data read from the flash memory array while applying an i-th verify voltage to the word line, the control circuit executes a logical operation, and writes a resultant pass or fail value to the neighbor cell buffer, and
when the fail value is included in data stored in the neighbor cell buffer, the control circuit applies a program pulse to a corresponding memory cell.

9. The flash memory according to 8, wherein, in the i-th program process, the control circuit writes the fail value to each bit of the neighbor cell data when a corresponding bit in data stored in the write buffer has the fail value and all data read from a memory cell or cells which are connected to a read bit line side of the same word line as that of a memory cell into which the bit is to be written and have an offset of i or less from the memory cell into which the bit is to be written, are in the erased state, and when otherwise, writes the pass value thereto.

10. The flash memory according to claim 8, wherein, in the i-th program process, the control circuit updates a corresponding bit in data stored in the neighbor cell buffer to have the pass value when the data read from the flash memory array while applying the i-th verify voltage to the word line is in the programmed state.

11. The flash memory according to claim 8, wherein the i-th verify voltage is higher than or equal to an (i−1)-th verify voltage, except when i is 0.

12. The flash memory according to claim 8, wherein the control circuit switches the i-th verify voltage into a plurality of values during execution of the i-th program process.

13. The flash memory according to claim 8, wherein the predetermined number n is 7 or less.

14. The flash memory according to claim 8, wherein:
the predetermined number is 3; and
in the i-th program process,
the control circuit writes the fail value to each bit of the neighbor cell data when a corresponding bit in data stored in the write buffer has the fail value and all data read from a memory cell or cells which are connected to a read bit line side of the same word line as that of a memory cell into which the bit is to be written and have an offset of 3 or less from the memory cell into which the bit is to be written, are in the erased state, and when otherwise, writes the pass value thereto,
when data read from the flash memory array while applying the i-th verify voltage to the word line is in the programmed state, the control circuit updates a corresponding bit in data stored in the neighbor cell buffer to have the pass value, and
when the i-th verify voltage is higher than or equal to an (i−1)-th verify voltage when i is 1 or more and 3 or less.

15. The flash memory according to claim 1, wherein the neighbor cell buffer has a capacity two or more times larger than that of the write buffer, and
when the neighbor cell data is being calculated, for a bit in data stored in the write buffer, two or more pieces of data read from memory cells which are connected to the same word line as that of a memory cell to which the bit is to be written and have an offset of a predetermined number n or less (where n is a positive integer), is stored simultaneously.

16. The flash memory according to claim 1, wherein the write buffer and the neighbor cell buffer are composed of registers.

17. The flash memory according to claim 1, wherein the write buffer and the neighbor cell buffer are composed of an SRAM.

18. The flash memory according to claim 1, wherein the write buffer and the neighbor cell buffer are composed of a single memory which includes both of them.

19. The flash memory according to claim 1, wherein the write buffer and the neighbor cell buffer are each composed of a plurality of memories which operate independently.

20. The flash memory according to claim 1, wherein the write buffer and the neighbor cell buffer are composed of a plurality of memories including a first area used as the write buffer and a second area used as the neighbor cell buffer, and
the second area included in one of the memories is associated with the first area included in another of the memories.

21. The flash memory according to claim 1, wherein a one-time amount of the write data to the flash memory array is written into memory cells which are located at a distance of more than predetermined number n (where n is a positive integer) of memory cells in the word line direction from each other in the flash memory array.

22. The flash memory according to claim 21, wherein the predetermined number n is 3.

23. The flash memory according to claim 1, wherein
the control circuit includes:

a logical/physical address translator converting a logical Y address which is used when selecting the bit line in the flash memory array, to a physical Y address corresponding to a physical location of a memory cell in the flash memory array;

an adder-subtractor executing addition or subtraction based on the physical Y address and a given offset to obtain an offset-added physical Y address; and a physical/logical address translator converting the offset-added physical Y address to an offset-added logical Y address, wherein the control circuit shifts data read from the flash memory array when an overflow or an underflow occurs in the adder-subtractor.

24. A program verify method for a flash memory, the flash memory comprising: a flash memory array including memory cells, a word line, and a bit line shared by memory cells neighboring each other in a direction of the word line; a write buffer functioning as a buffer for write data to the flash memory array; and a control circuit executing a program verify process with respect to the flash memory array, and the flash memory further comprising a neighbor cell buffer having a capacity which is larger than or equal to that of the write buffer, the program verify method comprising:

writing the input write data to the write buffer;

executing a logical operation based on the write data and data read from the flash memory array, and writing an obtained result as neighbor cell data to the neighbor cell buffer;

executing a verify process between the write data and the flash memory array and executing a verify process between the neighbor cell data and the flash memory array; and applying a program pulse to a memory cell corresponding to a bit at which the verify process has failed.

25. The program verify method according to claim 24, wherein:

writing the write data includes writing a pass value indicating no requirement of a program process and a fail value indicating requirement of a program process to the write buffer based on the input write data;

writing the neighbor cell data includes:

copying data stored in the write buffer into the neighbor cell buffer;

executing a logical operation between memory cells connected to the same word line, an offset therebetween being smaller than or equal to a predetermined number n (where n is a positive integer), based on data stored in the neighbor cell buffer, and data read from the flash memory array while applying a read voltage to the word line, and writing a resultant pass or fail value as the neighbor cell data to the neighbor cell buffer;

executing the verify process includes:

executing a logical operation based on data stored in the write buffer, and data read from the flash memory array while applying a first verify voltage to the word line, and writing a resultant pass or fail value to the write buffer; and executing a logical operation based on data stored in the neighbor cell buffer, and data read from the flash memory array while applying to the word line a second verify voltage which is different from the first verify voltage, and writing a resultant pass or fail value to the neighbor cell buffer; and applying the program pulse includes:

when the fail value is included in data stored in the write buffer or the neighbor cell buffer, applying a program pulse to a corresponding memory cell.

26. The program verify method according to claim 25, wherein each bit of the neighbor cell data is set to have the fail value when a corresponding bit in data stored in the write buffer has the fail value and all data read from a memory cell or cells which are connected to a read bit line side of the same word line as that of a memory cell into which the bit is to be written and have an offset of the predetermined number n or less from the memory cell into which the bit is to be written, are in the erased state, and when otherwise, is set to have the pass value.

27. The program verify method according to claim 24, wherein:

writing the write data includes writing a pass value indicating no requirement of a program process and a fail value indicating requirement of a program process into the write buffer based on the input write data;

executing an i-th program process where i is an integer of 0 or more and a predetermined number n or less (where n is a positive integer) is included as writing the neighbor cell data, executing the verify process, and applying the program pulse; and executing the i-th program process includes:

copying data stored in the write buffer into the neighbor cell buffer;

based on data stored in the neighbor cell buffer and data read from the flash memory array while applying a read voltage to the word line, executing a logical operation between memory cells which are connected to the same word line and have an offset of i or less, except when i is 0, and writing a resultant pass or fail value as the neighbor cell data to the neighbor cell buffer;

based on data stored in the neighbor cell buffer and data read from the flash memory array while applying the i-th verify voltage to the word line, executing a logical operation, and writing a resultant pass or fail value to the neighbor cell buffer; and when the fail value is included in data stored in the neighbor cell buffer, applying a program pulse to a corresponding memory cell.

28. The program verify method according to claim 27, wherein, in executing the i-th program process, each bit of the neighbor cell data is set to have the fail value when a corresponding bit in data stored in the write buffer has the fail value and all data read from a memory cell or cells which are connected to a read bit line side of the same word line as that of a memory cell into which the bit is to be written and have an offset of i or less from the memory cell into which the bit is to be written, are in the erased state, and when otherwise, is set to have the pass value.

* * * * *